United States Patent Office 3,794,491
Patented Feb. 26, 1974

3,794,491
AMPLIFICATION OF LOW-DENSITY POLYYNE IMAGES

Paul M. Borsenberger, Hilton, Alfredo R. Guevara, Webster, and Joseph W. Manthey, Rochester, N.Y., assignors to Eastman Kodak Company, Rochester, N.Y.
No Drawing. Filed June 14, 1972, Ser. No. 262,912
Int. Cl. G03c 5/24, 5/32
U.S. Cl. 96—48 R 12 Claims

ABSTRACT OF THE DISCLOSURE

Images formed in a layer of polyacetylenic material can be amplified by subjecting the imaged layer to radiation which is preferentially absorbed by the image areas.

FIELD OF INVENTION

This invention relates to the field of non-silver direct print-out imaging and more particularly to methods of enhancing direct print-out images.

DESCRIPTION OF PRIOR ART

U.S. Pat. Nos. 3,501,297 by Cremeans, 3,501,202 by Foltz, 3,501,303 by Foltz and 3,501,308 by Adelman, all issued Mar. 17, 1970, disclose various imaging elements comprised of a carrier having fixedly positioned thereon discrete crystals of certain photosensitive polyacetylenic compounds. According to the disclosure of the prior art, the described elements are typically imagewise exposed to certain radiant energy (e.g., ultraviolet radiation). This exposure results in the imagewise polymerization of the polyacetylenic compound to a colored polymeric product. Prior techniques for using these elements frequently required high levels of ultraviolet radiation in order to obtain reasonable density. Where low levels of ultraviolet radiation are used, the resultant image is typically of low density. In addition, other known imaging techniques for polyacetylenic compounds frequently result in images having low density.

As prior procedures for utilizing elements containing polyacetylenic compounds generally do not result in images of sufficient density unless exposed to high levels of ultraviolet radiation, there is a need for a process of amplifying low density images formed from polyacetylenic compounds.

SUMMARY OF INVENTION

We have found that a low density image formed on a layer of microcrystals of a photosensitive polyacetylenic compound can be amplified by a convenient procedure. This amplification is accomplished by a subsequent uniform exposure to radiation which is preferentially absorbed by the colored polymeric product. This dry image development technique provides enhanced density per unit exposure resulting in higher apparent speed. This uniform exposure may occur while the layer is being subjected to an electric field.

DESCRIPTION OF PREFERRED EMBODIMENTS

The objects and advantages of the present invention are accomplished using elements carrying a layer of a polyacetylenic compound, also referred to as a polyyne. These elements can be prepared in a variety of forms. Typically, the element is comprised of a suitable support having thereon an image recording layer comprising a crystalline polyyne compound having a minimum of two acetylenic linkages as a conjugated system. This image recording layer can be a binder-free layer or can involve a suitable binder material such as gelatin, poly(vinyl alcohol), or other polymers. These layers usually vary in thickness from about 3 to about 10 micrometers.

The polyacetylenic materials useful in this invention include numerous polyacetylenic compositions reported in the literature as exhibiting color change upon exposure to actinic radiation. Such photosensitive polyacetylenic or polyyne compounds taught in the art contain a minimum of two acetylenic linkages as a conjugated system $$\text{(i.e., } —C{\equiv}C—C{\equiv}C—)$$

and, with only a few exceptions, carbon atoms in alpha positions to the acetylenic carbon atoms, i.e., those carbon atoms directly connecting to the acetylenic carbon atoms, are bonded directly onto the carbon and/or hydrogen atoms. These photosensitive polyacetylenic compositions of matter encompass diynes, triynes, tetraynes, higher polyynes and numerous derivatives and related compounds thereof of various chemical classes ranging from hydrocarbon compounds to acids, esters, diols, to still other compounds of other chemical classifications containing numerous and varied organic radicals stemimng from the conjugated acetylenic carbon atoms, all of which are termed polyyne compounds for purposes of this invention.

As is apparent from publications of such investigators as Arthur Seher, Ferdinand Bohlmann et al., R. H. Jones and M. C. Whiting, procedures are known in the art for preparation of polyacetylenic compositions. Preparatory techniques are also taught in U.S. Pats. 2,816,149; 2,941,-014; 3,065,283; etc. General preparative methods include: oxidative coupling or oxidative dehydrocondensation reactions of numerous terminal acetylenic compounds to prepare as desired, symmetrical and unsymmetrical polyyne compounds; dehydrohalogenation reactions to provide compounds containing acetylenic bonds; and variations, modifications and combinations of such two basic reactions to provide preparative routes for a multitude of energy-sensitive polyacetylenic compositions of matter.

Although the prior art typically refers to imaging polyyne layers by exposure to ultraviolet radiation, for example, the present amplification technique has utility with low density images formed by any means involving activating energy. Activating energy for purposes of this invention includes various forms of (a) actinic radiation such as ultraviolet and visible radiation, (b) electrical energy such as electron beams, ion bombardment, charged particle injection, etc., and (c) combinations of actinic radiation and electrical energy. Exemplary of means for imaging polyyne materials other than by the usual imagewise exposure to actinic radiation are the procedures described in copending applications of Borsenberger et al. U.S. Ser. No. 209,868, filed Dec. 20, 1971, now U.S. Pat. No. 3,726,769, entitled Dry, Instant Access Electrosensitive Recording Elements and Methods, and Guevara et al. U.S. Ser. No. 195,778, filed Nov. 4, 1971, now U.S. Pat. No. 3,742,376, entitled Print-Out Elements and Methods.

The term "energy-sensitive" as used herein has reference to the propensity of various polyyne materials to polymerize to a highly colored polymerization product upon being subjected to activating energy as described above. It is within the skill of the art to evaluate the energy-sensitivity of a polyyne if this property is unknown. One needs merely to expose samples of prepared crystalline polyacetylenic compositions of matter to suitable activating energy as described herein and to observe whether a visible color change occurs in the areas of applied energy. If a visible color change occurs upon application of a suitable potential, then the polyyne is deemed energy-sensitive.

As in the case of exposure to ultraviolet radiation, exposure to other forms of activating energy by whatever means results in the imagewise polymerization of the polyyne to a colored polymeric product. This product has an absorbance spectrum different from the unimaged polyyne and is conveniently referred to as the photoproduct. However, it is to be understood that the term photoproduct has reference to the initially colored polymeric product regardless of how it was formed.

Illustrative and representative of the energy-sensitive crystalline polyacetylenic compounds to which the invention is applicable are those disclosed in U.S. Pats. 3,501,297; 3,501,302; 3,501,303; and 3,501,308 referred to above. Typically, the polyyne crystals have a size in the range of about 0.1 to about 1.5 microns.

As mentioned previously, the polyyne material can be coated as a separate layer in a suitable binder. Exemplary binder materials include: natural and synthetic plastics, resins, waxes, colloids, gels and the like, including gelatins (desirably photographic-grade gelatin) various polysaccharides including dextran, dextrin, hydrophilic cellulose ethers and esters, acetylated starches, natural and synthetic waxes including paraffin, beeswax, polymers of vinyl lactams, polymers of acrylic and methacrylic esters and amides, hydrolyzed interpolymers of vinyl acetate and unsaturated addition polymerizable compounds such as maleic anhydride, acrylic and methacrylic esters and styrene, vinyl acetate polymers and copolymers and their derivatives including completely and partially hydrolyzed products thereof, polyvinyl acetate, polyvinyl alcohol, polyethylene oxide polymers, polyvinylpyrrolidone, polyvinyl butyraldehyde acetal, polyvinyl sodium-o-sulfobenzaldehyde acetal, polyvinyl formaldehyde acetal, and numerous other known photographic binder materials. As is well known in the art in the preparation of smooth uniform continuous coatings of binder materials, there may be employed therewith small amounts of conventional coating aids as viscosity controlling agents, leveling agents, dispersing agents, and the like. The particular binder material employed is selected with due regard to the specific energy and technique to be employed in the particular image-recording application, and invariably is a binder material permitting substantial transmission of that specific energy to be employed.

Various methods known in the art can be used for forming layers of polyyne material in a binder. See, for example, Foltz U.S. Pat. No. 3,501,302, issued Mar. 17, 1970.

If it is desired to prepare a binder-free layer of polyyne material, this can be accomplished by applying to a substrate a solution of polyyne in a suitable solvent followed by drying.

In accordance with this invention, a suitable polyyne layer is exposed to activating energy to imagewise polymerize the polyyne to firm a colored polymeric photoproduct. This product has a wavelength range of absorption different from the wavelength of the actinic radiation often used in the original imagewise exposure. The original exposure typically utilizes a low intensity ultraviolet radiation source as the majority of known polyyne materials are sensitive to ultraviolet (UV) illumination. This UV exposure results in the formation of a low density image. After formation of this low density image, the layer is subjected to a uniform exposure to radiation in the wavelength range of absorption of the polymeric photoproduct but different from the wavelength of the actinic radiation utilized in the original imagewise exposure. Of course, as discussed previously, the original low density image can be formed by means other than or in addition to exposure to actinic radiation. Regardless of how the image is originally formed, it is amplified by uniform exposure to radiation which is preferentially absorbed by the polymeric photoproduct. The radiation used for this uniform exposure preferably has a wavelength range corresponding to the absorbance spectrum of the particular photoproduct involved.

A preferred amplification technique includes the additional step of subjecting the polyyne layer to an electric field during the uniform non-imagewise exposure. The intensity of the electric field can vary depending upon the particular polyyne and/or binder used in the sensitive layer. This field can be created using two plate electrodes at least one of which is transparent to the wavelength of radiation used during the uniform exposure. These electrodes are placed on opposite sides of the polyyne layer and an electrical potential is applied. Typically, these electrodes are spaced about 3 to about 10 micrometers and the applied electrical potential is in the range of about 50 to about 150 volts. In general, the intensity of the electrical field must be sufficient to result in an increase in density of the image areas upon uniformly exposing as described. The minimum value will vary but usually is about $10^{-3}$ volts per centimeter of layer thickness.

A convenient means of providing one of the requisite electrodes is to form the polyyne layer directly on a conductive support. Suitable supporting materials for the polyyne layers of the present invention can include any of a wide variety of electrically conducting supports, for example, various conducting papers; aluminum coated paper; aluminum-paper laminates; metal foils such as aluminum foil, zinc foil, etc; metal plates such as aluminum, copper, zinc, brass, and galvanized plates; vapor deposited metal layers such as silver, nickel or aluminum on conventional glass or film supports such as cellulose acetate, poly(ethylene terephthalate), polystyrene and the like conducting supports. An especially useful conducting support can be prepared by coating a support material such as poly(ethylene terephthalate) with a layer containing a semiconductor dispersed in a resin as described in U.S. Pat. No. 3,245,833 by Trevoy, issued Apr. 12, 1966.

The illuminating source for the uniform exposure can be any of a variety of suitable light sources. In general, this overall exposure is to a source of radiation having a wavelength range corresponding substantially with the absorbance spectrum of the photoproduct. This results in the preferential absorption of radiation by the colored image areas during the uniform overall exposure.

The following examples are included for a further understanding of the invention.

EXAMPLE 1

A filtered 10% (by weight) solution of 10,12-docosadiynedioic acid monomethyl ester in dichloroethane is applied to a film support comprised of a layer of evaporated nickel on poly(ethylene terephthalate). The optical density of the conductive support is 0.15. The polyyne solution is applied on the nickel side of the support using a 0.004 inch coating knife. The estimated dry thickness of the polyyne layer is about 5$\mu$m. Immediately after solvent evaporation, the coating is exposed through an image mask using a calibrated UVS–11 low pressure mercury arc lamp at a distance of 40 cm. for one second, resulting in an exposure of roughly 300 ergs./cm.$^2$ incident on the film plane. The exposure porduces a blue print-out image having a red filter transmission density of 0.08 above base density. A metal plate electrode is then placed on the surface of the polyyne layer and a source of potential is connected to the electrode and to the nickel conducting layer. The print-out image thus obtained is then given a second exposure. The exposure is made by passing the output of a 150 watt Xenon lamp through a Bausch and Lomb monochromator set at 470 nanometers with entrance and exit slits set at 3.5 and 2.0 millimeters, respectively. A Wratten 2A filter with a cutoff at approximately 420 nanometers is placed in the exit beam from the monochromator. A 3.0 minute exposure is made with a potential of −60 volts impressed across the polyyne layer. The resulting image densities are shown in Table I.

EXAMPLE 2

A second coating is prepared as described in Example 1. Several initial UV exposures are made on a sample of the coating, after solvent evaporation resulting in print-out images having red filter transmission densities in the range of 0.08 to 0.12. The resulting images are then amplified using the electro-optical technique described in Example 1. The following conditions of voltage and exposure time are used: Example 2A, −100 volts, 8 minutes; Example 2B, −60 volts, 10 minutes; Example 2C, −60 volts, 8 minutes; and Example 2D, +60 volts, 8 minutes. The resulting red filter transmission densities are shown in Table I.

EXAMPLE 3

Another coating is prepared and pre-exposed in the manner of Examples 1 and 2. After solvent evaporation, samples of the coating are given several UV exposures resulting in images having red filter transmission densities of 0.08 to 0.16. The resulting images are then amplified by the technique described in Example 1 using the following conditions of exposure and applied electrical potential: Example 3A, −60 volts, 8.0 minutes; Example 3B, −60 volts, 12 minutes (initial density 0.16); Example 3C, −60 volts, 12 minutes (initial density 0.08). The resulting red filter transmission densities are tabulated in Table I.

EXAMPLE, 4

Two samples of the coating described in Example 2 are pre-exposed with a UVS–11 lamp to produce image areas having a red filter density of 0.07. One of the samples (4A) is subjected to the image amplification technique described in Example 1 using a DC voltage of −120 volts during an exposure time of 22 minutes. The second sample (4B) is subjected to the same image amplification technique except that an alternating current source is used at a potential of 120 volts (RMS) during a 22 minute exposure time. The resulting red filter transmission densities are shown in Table I.

TABLE I.—RED FILTER TRANSMISSION DENSITIES, BEFORE AND AFTER AMPLIFICATION

| Ex. | Amplification: Potential, v. | Amplification: Time, min. | Background density: Initial | Background density: After amplification | Image density: Initial | Image density: After amplification | Image differential: Initial | Image differential: After amplification |
|---|---|---|---|---|---|---|---|---|
| 1 | −60 | 3.0 | .01 | .07 | .16 | .42 | .15 | .35 |
| 2A | −100 | 8.0 | .01 | .04 | .08 | .35 | .07 | .31 |
| 2B | −60 | 10.0 | .02 | .08 | .10 | .45 | .08 | .37 |
| 2C | −60 | 8.0 | .04 | .06 | .11 | .38 | .07 | .32 |
| 2D | −60 | 3.0 | .06 | .08 | .10 | .30 | .04 | .22 |
| 3A | −60 | 3.0 | .04 | .12 | .10 | .48 | .06 | .36 |
| 3B | −60 | 8.0 | .03 | .11 | .16 | .54 | .13 | .43 |
| 3C | −60 | 12.0 | .04 | .06 | .08 | .26 | .04 | .20 |
| 4A | −120 | 22.0 | .01 | .37 | .07 | .72 | .06 | .35 |
| 4B | (1) | 22.0 | .01 | .06 | .06 | .30 | .05 | .24 |

[1] 120 (RMS).

NOTE.—Image differential=Image density−background density.

EXAMPLE 5

A solution of 476 milligrams of methyl - 21 - [N-(3-methoxypropyl)carbamoyl]-10,12 - heneicosadiynoate in 1.5 ml. of chloroform is filtered and added to 4 ml. of a 12% aqueous gelatin solution, 0.5 ml. of a 10% water-alcohol solution (50:50) of a wetting agent and 4.0 ml. of distilled water. After thorough mixing, the resultant composition is coated with a 0.004 inch coating blade on a poly(ethylene terephthalate) support carrying a conductive layer of cuprous iodide in cellulose nitrate. The coating is chill set and allowed to dry at room temperature. The resultant element is placed in a standard electron beam recording apparatus and exposed to 15 kv. electrons while in a vacuum to form a series of varying density images. The resulting images are then optically amplified by subjecting the images to a succession of exposures to the light of a No. 1 floodlamp. The heating effect of this light source is minimized by heat-absorbing glass and forced air cooling of the sample which is located about 4 inches from the front envelop of the lamp. After each 100 second exposure under this setup, the densities are measured again, until a total of four exposures has been completed. Table II below shows the initial density due to the electron beam (EB) exposure and the resultant density after each additional 100 seconds of exposure to a No. 1 floodlamp.

TABLE II

| | Density after additional overall exposure: +100″ | +200″ | +300″ | +400″ |
|---|---|---|---|---|
| EB exposure density: | | | | |
| .4 | .65 | .83 | 1.0 | 1.1 |
| 1.0 | 1.25 | 1.35 | 1.5 | 1.7 |
| 1.6 | 1.8 | 1.95 | 2.0 | 2.1 |

The invention has been described in detail with particular reference to certain preferred embodiments thereof, but it will be understood that variations and modifications can be effected within the spirit and scope of the invention.

We claim:

1. In a process of forming print-out images on a sensitive element having a layer of a crystalline polyacetylenic compound having a minimum of two acetylenic linkages as a conjugated system by imagewise exposing said layer to activating energy to imagewise polymerize said compound to a colored polymeric product, the improvement wherein after said imagewise exposure, said element is given a uniform exposure to radiation of a wavelength within the wavelength range of absorption of said polymeric product.

2. The invention as described in claim 1 wherein said layer is subjected to an electrical potential during said uniform exposure.

3. In a process of forming print-out images on a sensitive element having a layer of a crystalline polyacetylenic compound having a minimum of two acetylenic linkages as a conjugated system by exposing said layer to actinic radiation to imagewise polymerize said compound to a colored polymeric product, the improvement wherein after said imagewise exposure, said element is given a uniform exposure to radiation of a wavelength different than said actinic radiation and within the wavelength range of absorption of said polymeric product .

4. The invention as described in claim 3 wherein said layer is subjected to an electrical potential during said uniform exposure.

5. In a process of forming print-out images on a sensitive element having a layer of a crystalline polyacetylenic compound having a minimum of two acetylenic linkages as a conjugated system by subjecting said layer to an imagewise exposure to ultraviolet radiation to imagewise polymerize said compound to a colored polymeric product, the improvement wherein after said imagewise exposure, said element is given a uniform exposure to radiation of a wavelength longer than that of said ultraviolet radiation and within the wavelength range of absorption of said polymeric product, said uniform exposure occurring while said layer is subjected to an electric field.

6. The invention as described in claim 5 wherein said layer includes a gelatin binder.

7. The invention as described in claim 5 wherein said element includes an electrically conductive support.

8. In a process of forming print-out images on a sensitive element comprising an electrically conductive support having thereon a layer of a binder material having dispersed therein particles of a crystalline polyacetylenic compound having a minimum of two acetylenic linkages as a conjugated system wherein said element is exposed to ultraviolet radiation to imagewise polymerize said compound to a colored polymeric product, the improvement comprising the step of subsequently uniformly exposing said element to radiation of a wavelength longer than said ultraviolet radiation and within the wavelength range of absorption of said polymeric product, said uniform exposure occurring while said layer is subjected to an electric field thereby increasing the optical density of said polymeric product.

9. The invention as described in claim 8 wherein said electrical field is applied by applying an electrical potential difference between said conductive support and an electrode adjacent the surface of said layer opposite said support.

10. The invention as described in claim 9 wherein said potential difference has a value of about 50 to about 1500 volts.

11. A process for the amplification of a printout image formed on an element having a sensitive layer comprised of a polyacetylenic compound having a minimum of two acetylenic linkages as a conjugated system, said process comprising the step of uniformly exposing said layer to radiation within the wavelength range of absorption of said print-out image.

12. A process for the amplification of a printout image formed on an element having a sensitive layer comprised of a polyacetylenic compound having a minimum of two acetylenic linkages as a conjugated system, said process comprising the steps of subjecting said layer to an electric field and, during the application of said field, uniformly exposing said layer to radiation which is preferentially absorbed in the areas of said print-out image.

References Cited

UNITED STATES PATENTS

| | | | |
|---|---|---|---|
| 3,501,297 | 3/1970 | Cremeans | 96—48 R |
| 3,501,302 | 3/1970 | Foltz | 96—48 R |
| 3,501,303 | 3/1970 | Foltz et al. | 96—48 R |
| 3,501,308 | 3/1970 | Adelman | 96—48 R |
| 3,547,633 | 12/1970 | Rust | 96—45.2 |
| 3,743,505 | 7/1973 | Bloom et al. | 96—48 R |

NORMAN G. TORCHIN, Primary Examiner

R. L. SCHILLING, Assistant Examiner

U.S. Cl. X.R.

96—45.2, 48 QP, 119 PQ

UNITED STATES PATENT OFFICE

CERTIFICATE OF CORRECTION

PATENT NO. : 3,794,491

DATED : Feb. 26, 1974

INVENTOR(S) : Paul M. Borsenberger, Alfredo R. Guevara, Joseph Manthey

It is certified that error appears in the above-identified patent and that said Letters Patent are hereby corrected as shown below:

Column 3, between lines 25 and 26 insert --vinyl acetals including polyvinyl acetaldehyde acetal, poly- --.

Column 3, line 48, change "firm" to --form--.

Signed and sealed this 15th day of July 1975.

(SEAL)
Attest:

RUTH C. MASON
Attesting Officer

C. MARSHALL DANN
Commissioner of Patents and Trademarks